United States Patent
Shiu et al.

(10) Patent No.: US 9,753,077 B2
(45) Date of Patent: Sep. 5, 2017

(54) ABNORMAL CONNECTION DETECTION METHOD

(71) Applicant: RICHTEK TECHNOLOGY CORPORATION, Chupei, HsinChu (TW)

(72) Inventors: Yi-Min Shiu, Hsinchu (TW); Yi-Shan Chu, Zhubei (TW); Shih-Jen Yang, New Taipei (TW)

(73) Assignee: RICHTECK TECHNOLOGY CORPORATION, Chupei, Hsinchu (TW)

( * ) Notice: Subject to any disclaimer, the term of this patent is extended or adjusted under 35 U.S.C. 154(b) by 57 days.

(21) Appl. No.: 14/803,689

(22) Filed: Jul. 20, 2015

(65) Prior Publication Data

US 2016/0033566 A1 Feb. 4, 2016

Related U.S. Application Data

(60) Provisional application No. 62/031,630, filed on Jul. 31, 2014.

(51) Int. Cl.
*H02H 3/08* (2006.01)
*H02H 3/087* (2006.01)
*G01R 31/04* (2006.01)
*H02H 3/44* (2006.01)

(52) U.S. Cl.
CPC ............ *G01R 31/045* (2013.01); *H02H 3/08* (2013.01); *H02H 3/087* (2013.01); *H02H 3/445* (2013.01)

(58) Field of Classification Search
CPC ........... H02H 3/08; H02H 3/087; H02H 3/445
USPC ....................................................... 361/91.1
See application file for complete search history.

(56) References Cited

U.S. PATENT DOCUMENTS 8,830,645 B2 * 9/2014 Kojovic .................. H02H 3/20
361/72

* cited by examiner

*Primary Examiner* — Dharti Patel
(74) *Attorney, Agent, or Firm* — Tung & Associates

(57) ABSTRACT

An abnormal connection detection method is used between a power supplier and a power receiver. The power supplier and the power receiver are connected through a cable. The cable includes positive and negative power transmission lines. The abnormal connection detection method includes: providing an output voltage from the power supplier, wherein the output voltage is lower than a predetermined voltage threshold; detecting, according to the output voltage, whether an output current generated by the power supplier is higher than a predetermined current threshold; and when the output current is higher than the predetermined current threshold, determining that an abnormal connection occurs between the power supplier and the power receiver.

12 Claims, 8 Drawing Sheets

ABNORMAL CONNECTION DETECTION METHOD

CROSS REFERENCE

The present invention claims priority to U.S. 62/031,630, filed on Jul. 31, 2014.

BACKGROUND OF THE INVENTION

Field of Invention

The present invention relates to an abnormal connection detection method; particularly, it relates to such abnormal connection detection method capable of determining whether an abnormal connection occurs by determining whether an output current generated by a power supplier is higher than a predetermined current threshold or by determining whether a slope of such output current is higher than a predetermined slope threshold during a predetermined time period.

Description of Related Art

Please refer to FIG. 1, which shows a block diagram of a conventional charging system. As shown in FIG. 1, the conventional charging system 100 comprises a power adapter 10, a cable 70 and an electronic device 20. The power adapter 10 and the electronic device 20 are coupled to each other through the cable 70. The power adapter 10 comprises at least a power regulator 11. The electronic device 20 includes at least a load 21. The cable 70 includes at least a positive power transmission line 71 and a negative power transmission line 73. When the power adapter 10 (acting as a power supplier) and the electronic device 20 (acting as a power receiver) are coupled to each other through the cable 70, the positive power transmission line 71 and the negative power transmission line 73 form a loop to transmit power.

Under an abnormal circumstance wherein there are dusts, threads or other unwanted materials within or on the connection port between the electronic device 20 and the cable 70, the positive power transmission line 71 and the negative power transmission line 73 may be shorted to form another current path, as shown by a dashed line resistor R35. Such abnormal situation will lead to an undesirable buildup of heat in the cable 70 and a power loss during power transmission, which, if not well-controlled, can become very dangerous.

In view of the above, to overcome the drawback in the prior art, the present invention proposes an abnormal connection detection method capable of determining whether an abnormal connection occurs by determining whether an output current generated by a power supplier is higher than a predetermined current threshold or by determining whether a slope of such output current is higher than a predetermined slope threshold during a predetermined time period.

SUMMARY OF THE INVENTION

From one perspective, the present invention provides an abnormal connection detection method for detecting an abnormal connection between a power supplier and a power receiver, wherein the power supplier and the power receiver are connected through a cable, the cable includes positive and negative power transmission lines, the abnormal connection detection method comprising: providing an output voltage from the power supplier, wherein the output voltage is lower than a predetermined voltage threshold; detecting, according to the output voltage, whether an output current generated by the power supplier is higher than a predetermined current threshold; and when the output current is higher than the predetermined current threshold, determining that an abnormal connection occurs between the power supplier and the power receiver occurs.

In one embodiment, the abnormal connection detection method further comprises: when the output current is lower than the predetermined current threshold, determining that a normal connection occurs between the power supplier and the power receiver.

In one embodiment, the abnormal connection detection method further comprises: when the abnormal connection occurs, stop supplying power from the power supplier to the power receiver.

In one embodiment, the cable further includes a signal transmission line, for transmitting a signal between the power supplier and the power receiver; and the power receiver further includes a switch, for enabling or disabling the power receiver to receive power from the power supplier.

In the above-mentioned embodiment, the abnormal connection detection method preferably further comprises: when the output current is lower than the predetermined current threshold, determining that an normal connection occurs between the power supplier and the power receiver; the power receiver receiving information indicating the normal connection from the power supplier through the signal transmission line; and conducting the switch of the power receiver so as to supply power from the power supplier to the power receiver.

In the above-mentioned embodiment, the abnormal connection detection method preferably further comprises: when the abnormal connection occurs, the power receiver receives information indicating the abnormal connection from the power supplier through the signal transmission line; and disconnecting the switch of the power receiver to stop supplying power from the power supplier to the power receiver.

In one embodiment, the predetermined voltage threshold is lower than a voltage required for a normal operation of a load in the power receiver.

From yet another perspective, the present invention provides an abnormal connection detection method for detecting an abnormal connection between a power supplier and a power receiver, wherein the power supplier and the power receiver are connected through a cable, the cable includes positive and negative power transmission lines, the abnormal connection detection method comprising: providing an output voltage from the power supplier and gradually increasing a level of the output voltage; determining, according to the output voltage, whether a slope of an output current generated by the power supplier is higher than a predetermined slope threshold during a predetermined time period; and when the slope is higher than the predetermined slope threshold during the predetermined time period, determining that an abnormal connection occurs between the power supplier and the power receiver.

In one embodiment, the abnormal connection detection method further comprises: when the slope is lower than the predetermined slope threshold during the predetermined time period, determining that a normal connection occurs between the power supplier and the power receiver.

In one embodiment, the abnormal connection detection method further comprises: when the abnormal connection occurs, stop supplying power from the power supplier to the power receiver.

In one embodiment, the cable further includes a signal transmission line, for transmitting a signal between the power supplier and the power receiver; and the power receiver further includes a switch, for enabling or disabling the power receiver to receive power from the power supplier.

In above-mentioned embodiment, the abnormal connection detection method preferably further comprises: when the slope is lower than the predetermined slope threshold during the predetermined time period, determining that a normal connection occurs between the power supplier and the power receiver; the power receiver receiving information indicating the normal connection from the power supplier through the signal transmission line; and conducting the switch of the power receiver so as to supply power from the power supplier to the power receiver.

In above-mentioned embodiment, the abnormal connection detection method preferably further comprises: when the abnormal connection occurs, the power receiver receiving information indicating the abnormal connection from the power supplier through the signal transmission line; and disconnecting the switch of the power receiver to stop supplying power from the power supplier to the power receiver.

The objectives, technical details, features, and effects of the present invention will be better understood with regard to the detailed description of the embodiments below, with reference to the attached drawings.

DESCRIPTION OF THE PREFERRED EMBODIMENTS

The above and other technical details, features and effects of the present invention will be will be better understood with regard to the detailed description of the embodiments below, with reference to the drawings. The drawings as referred to throughout the description of the present invention are for illustration only, to show the interrelations between the apparatus and devices, but not drawn according to actual scale.

Figure 1:
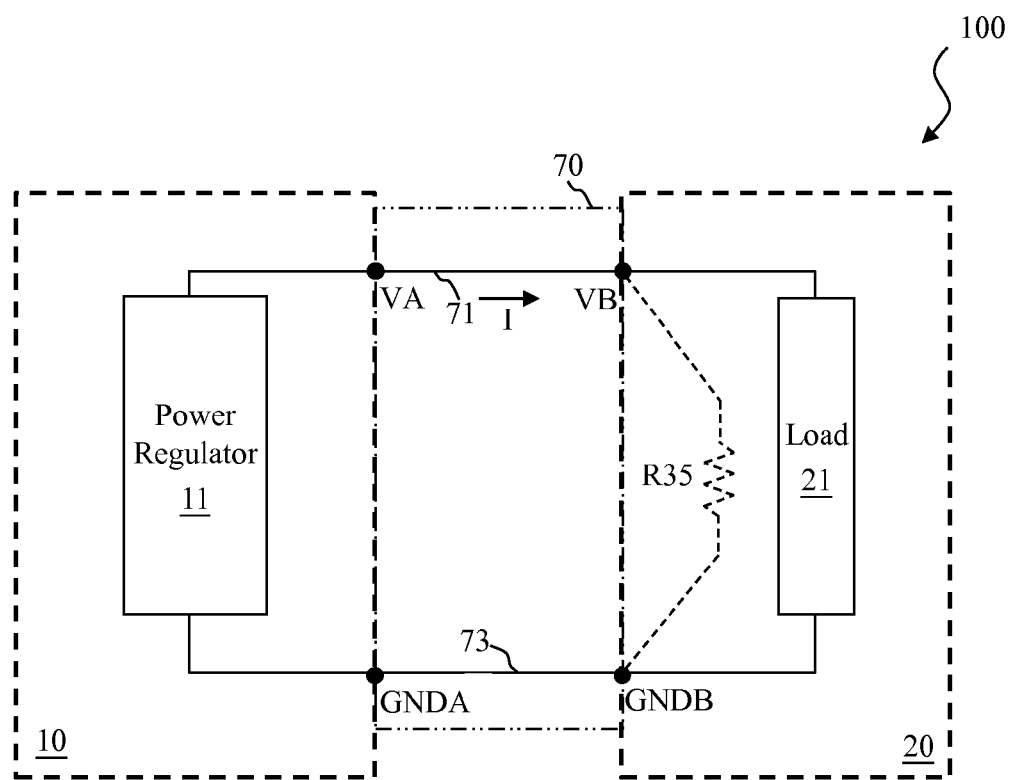
FIG. 1 shows a block diagram of a conventional charging system.
Figure 2A:
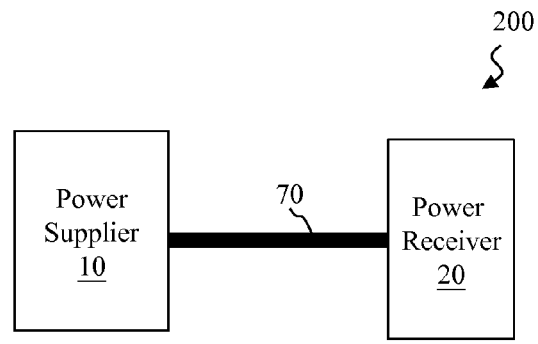
FIGS. 2A-2B show, under a normal connection, a block diagram of an embodiment of a charging system adopting the abnormal connection detection method of the present invention.
Figure 2B:
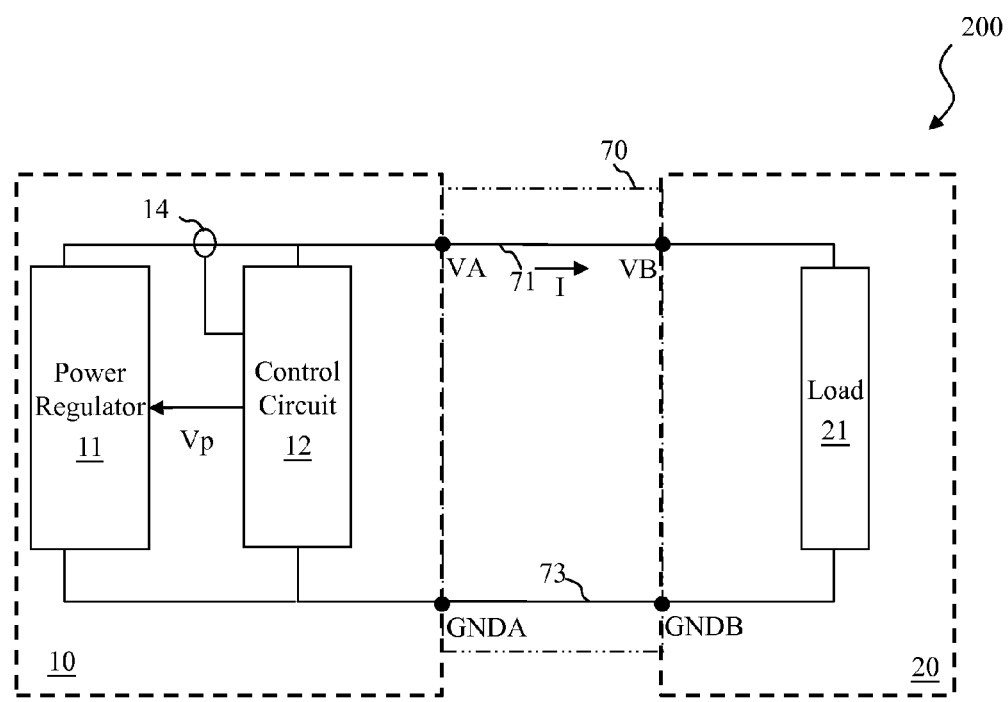
Figure 2C:
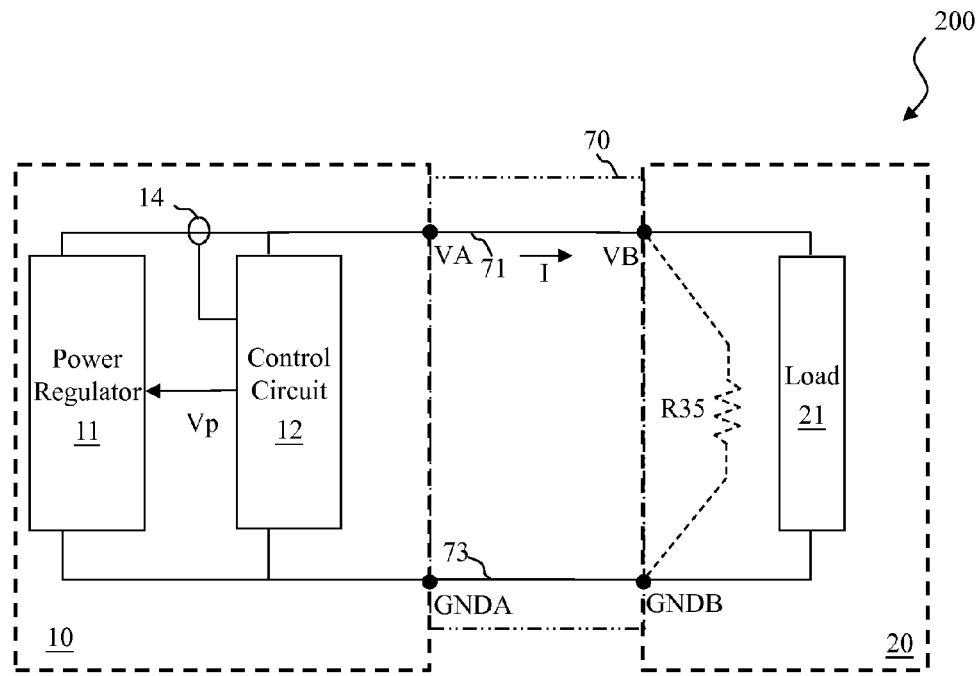
FIG. 2C shows, under an abnormal connection, a block diagram of an embodiment of a charging system adopting the abnormal connection detection method of the present invention.

Please refer to FIGS. 2A-2C. FIGS. 2A-2B show, under a normal connection, a block diagram of an embodiment of a charging system adopting the abnormal connection detection method of the present invention. FIG. 2C shows, under an abnormal connection, a block diagram of an embodiment of a charging system adopting the abnormal connection detection method of the present invention. As shown in FIG. 2A, the abnormal connection detection method of this embodiment can be applied in, for example but not limited to, a charging system 200. The charging system 200 of this embodiment comprises a power supplier 10, a cable 70 and a power receiver 20. The power supplier 10 and the power receiver 20 are coupled to each other through the cable 70, so that power is transmitted from the power supplier 10 to the power receiver 20. The present invention is capable of detecting whether or not an abnormal connection occurs (as shown in FIG. 2C). When an abnormal connection is detected, the present invention may, for example but not limited to, issue an alarm signal or stop supplying power from the power supplier 10 to the power receiver 20. Under a normal connection (as shown in FIG. 2B), the present invention may supply power from the power supplier 10 to the power receiver 20 (The details as to how an abnormal connection or a normal connection is detected will be described later).

As shown in FIG. 2B, in one embodiment, the power supplier 10 can be, for example but not limited to, a power adapter 10 (the power supplier 10 will hereafter be represented by the power adapter 10). The power receiver 20 can be, for example but not limited to, an electronic device 20 (the power receiver 20 will hereafter be represented by the electronic device 20). The power adapter 10 includes a power regulator 11, a current sensing circuit 14 and a control circuit 12. The current sensing circuit 14 senses an output current I generated by the power regulator 11 and transmits information related to the output current I to the control circuit 12. The control circuit 12 generates a control signal Vp according to the received information related to the output current I, so as to control an operation of the power regulator 11 (the details of the control circuit 12 will be described later). The power regulator 11 for example can be any type of switching power regulator, and the present invention is not limited to anyone of them. Besides, in this embodiment, the electronic device 20 includes a load 21. In this embodiment, the cable 70 includes at least a positive power transmission line 71 and a negative power transmission line 73. When the power adapter 10 (acting as a power supplier) and the electronic device 20 (acting as a power receiver) are coupled to each other through the cable 70, the positive power transmission line 71 and the negative power transmission line 73 form a loop to transmit power. That is, in this embodiment, the current I is transmitted from the power regulator 11 in the power supplier 10 to the load 21 in the power receiver 20. Therefore, the power supplier 10 can be regarded as a current transmitting side, while the power receiver 20 can be regarded as a current receiving side. Note that the abnormal connection detection method of the present invention is not limited to being applied in the charging system 200 of this embodiment, but can be applied in applications other than a charging system.

Figure 4A:
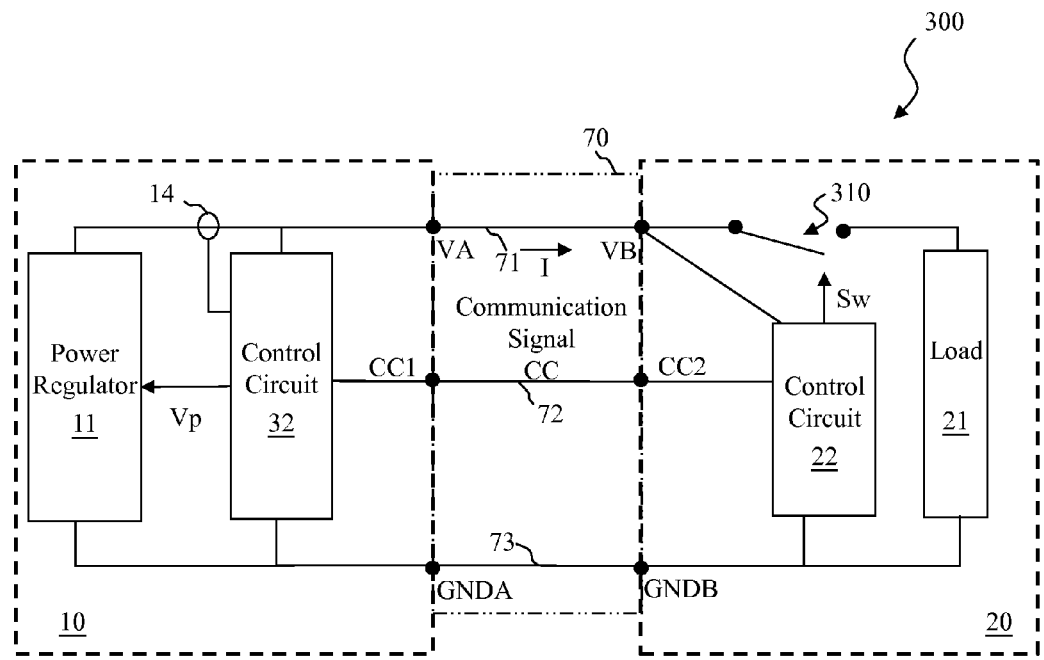
FIG. 4A shows, under a normal connection, a block diagram of another embodiment of a charging system adopting the abnormal connection detection method of the present invention.
Figure 4B:
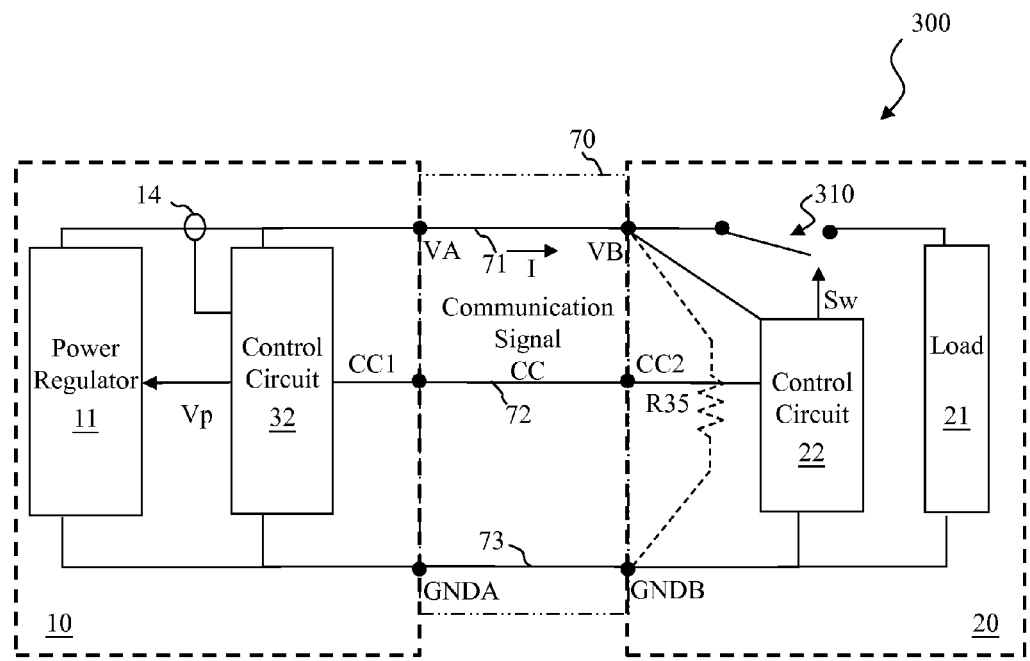
FIG. 4B shows, under an abnormal connection, a block diagram of another embodiment of a charging system adopting the abnormal connection detection method of the present invention.

Please refer to FIG. 4A-FIG. 4B. FIG. 4A shows, under a normal connection, a block diagram of another embodiment of a charging system adopting the abnormal connection detection method of the present invention. FIG. 4B shows, under an abnormal connection, a block diagram of another embodiment of a charging system adopting the abnormal connection detection method of the present invention. As shown in FIGS. 4A-4B, the abnormal connection detection method of the present invention can be applied in another charging system 300. The charging system 300 of this embodiment comprises a power supplier 10, a cable 70 and a power receiver 20. The power supplier 10 and the power receiver 20 are coupled to each other through the cable 70, so that power is transmitted from the power supplier 10 to the power receiver 20. When an abnormal connection is detected (as shown in FIG. 4B), this embodiment will disconnect a switch 310 in the power receiver 20, so as to stop supplying power from the power supplier 10 to the power receiver 20. When a normal connection is detected (as shown in FIG. 4A), this embodiment will conduct the switch 310 in the power receiver 20, so as to supply power from the power supplier 10 to the power receiver 20 (the details as to how an abnormal connection or a normal connection is detected will be described later).

As shown in FIG. 4A, in one embodiment, the power supplier 10 can be, for example but not limited to a power adapter 10 (the power supplier 10 will hereafter be represented by the power adapter 10). The power receiver 20 can be, for example but not limited to, an electronic device 20 (the power receiver 20 will hereafter be represented by the electronic device 20). The power adapter 10 includes a power regulator 11, a current sensing circuit 14 and a control circuit 32. The current sensing circuit 14 senses an output current I generated by the power regulator 11 and transmits information related to the output current I to the control circuit 32. The control circuit 32 generates a control signal Vp according to the received information related to the output current I, so as to control an operation of the power regulator 11 (the details of the control circuit 32 will be described later). The power regulator 11 for example can be any type of switching power regulator, and the present invention is not limited to anyone of them. Besides, in this embodiment, the electronic device 20 includes a load 21, a control circuit 22 and a switch 310. In this embodiment, the cable 70 includes, in addition to a positive power transmission line 71 and a negative power transmission line 73, a signal transmission line 72. When the power adapter 10 (acting as a power supplier) and the electronic device 20 (acting as a power receiver) are coupled to each other through the cable 70, the positive power transmission line 71 and the negative power transmission line 73 form a loop to transmit power. That is, in this embodiment, the current I is transmitted from the power regulator 11 at the power supplier 10 to the load 21 at the power receiver 20. Therefore, the power supplier 10 can be regarded as a current transmitting side, while the power receiver 20 can be regarded as a current receiving side.

In this embodiment, the control circuit 22 of the power receiver 20 receives information indicating normal connection or information indicating abnormal connection from the control circuit 32 of the power supplier 10 through the signal transmission line 72 (the information indicating normal connection or abnormal is represented by a communication signal CC). The control circuit 22 generates a switch control signal Sw according to the communication signal CC which indicates normal or abnormal connection, to control the switch 310, so that the power transmitted from the power supplier 10 to the power receiver 20 is under control (the details as to how an abnormal connection or a normal connection is detected will be described later).

Figure 3:
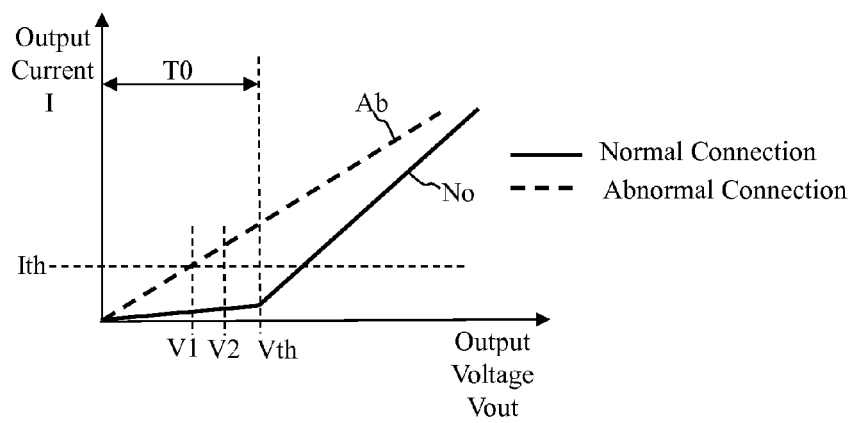
FIG. 3 shows relationships between the output voltage and the output current when the charging system is under a normal connection and an abnormal connection, respectively.
Figure 5A:
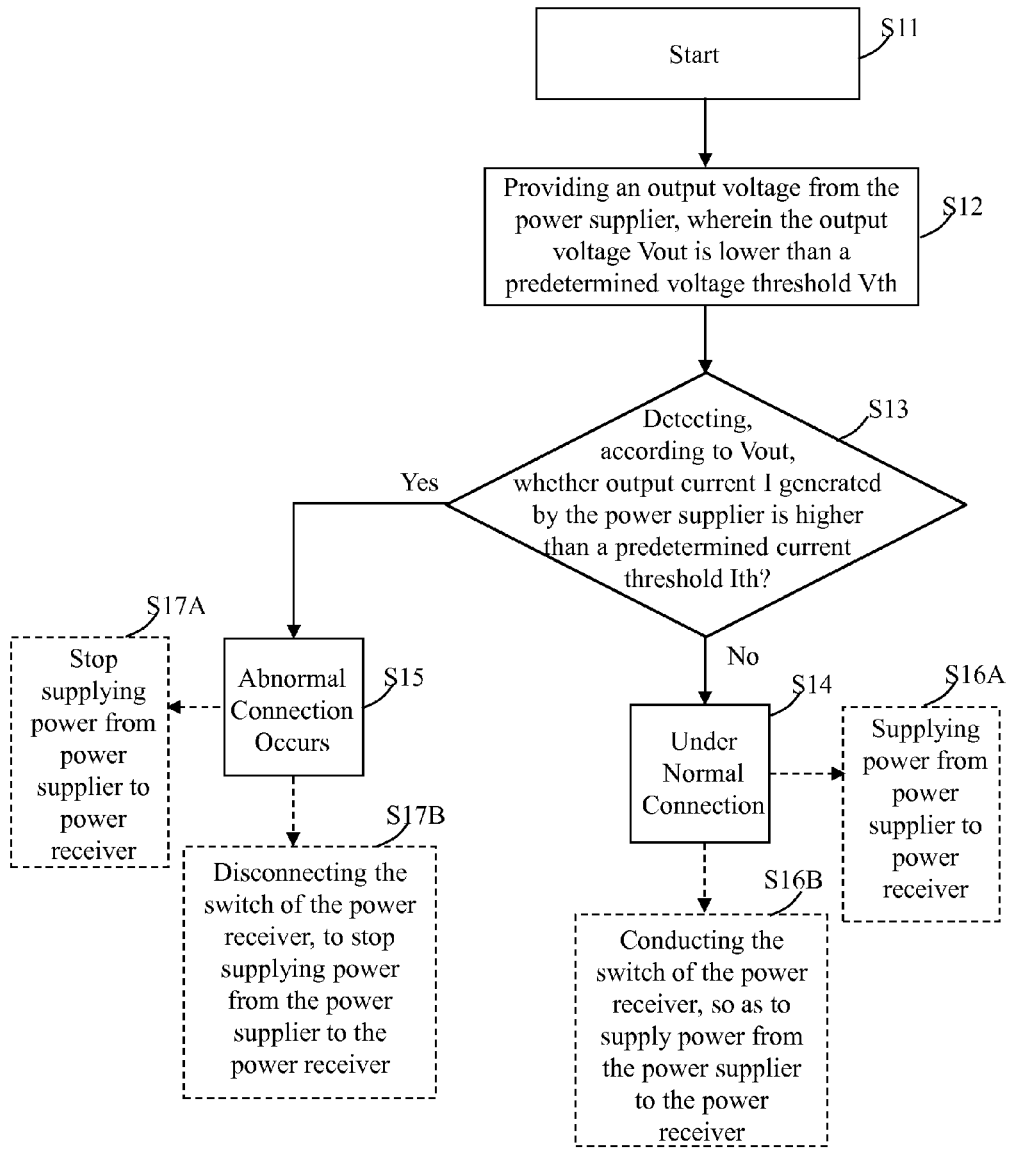
FIG. 5A shows a flow chart of an abnormal connection detection method according to an embodiment of the present invention.

Please refer to FIG. 3 and FIG. 5A. FIG. 3 shows relationships between the output voltage and the output current when the charging system is under a normal connection and an abnormal connection, respectively. FIG. 5A shows a flow chart of the abnormal connection detection method according to an embodiment of the present invention. The abnormal connection detection method of this embodiment comprises the following steps: In the beginning (the step S11 of FIG. 5A), the power adapter 10 (acting as a power supplier) provides an initial output voltage Vout by the power regulator 11, wherein the initial output voltage Vout is lower than a predetermined voltage threshold Vth (the step S12 of FIG. 5A). The predetermined voltage threshold Vth (as shown in FIG. 3) is a voltage required for a normal operation of a load 21 in the electronic device 20 (acting as a power receiver). "Normal operation" means that the load 21 can provide the function that it is designed to provide. That is, before the load 21 starts normal operation, the abnormal connection detection method of this embodiment can detect whether there is any abnormal condition in the power transmission loop of the cable 70. Next (the step S13 of FIG. 5A), the abnormal connection detection method of this embodiment detects, according to the output voltage Vout, whether an output current I provided by power regulator 11 is higher than a predetermined current threshold Ith (as shown in FIG. 3). As described above, the current sensing circuit 14 senses the output current I generated by the power regulator 11 and transmits the information related to the output current I to the control circuit 12 (as shown in FIGS. 2B-2C) or the control circuit 32 (as shown in FIGS. 4A-4B). Therefore, the control circuit 12 or the control circuit 32 can determine whether the output current I is higher than the predetermined current threshold Ith. For example, in the control circuit 12 or the control circuit 32, a comparator can be used to compare a signal related to the output current I (for example but not limited to a voltage signal converted from the output current I) with a signal related to the predetermined current threshold Ith (for example but not limited to a voltage reference signal corresponding to the predetermined current threshold Ith).

More specifically, as shown in FIG. 3, under normal connection, the load 21 will not start normal operation to consume current until the output voltage Vout reaches the predetermined voltage threshold Vth (as shown by the solid line No in FIG. 3). However, under abnormal connection, before the output voltage Vout reaches the predetermined voltage threshold Vth, there will be abnormal current consumed by an undesired current path (as shown by the dashed line Ab in FIG. 3). Therefore, in one embodiment, the present invention can determine whether an abnormal connection occurs by determining whether the output current I is higher than the predetermined current threshold Ith when the output voltage Vout provided by the power regulator 11 has not yet reached the predetermined voltage threshold Vth. If the output current I is kept not higher than the predetermined current threshold Ith before the output voltage Vout reaches the predetermined voltage threshold Vth (as shown by the solid line No in FIG. 3), it can be determined that the charging system 200 or 300 is under normal connection (the step S14 of FIG. 5A).

Next, in one embodiment, as shown in FIG. 2B, once the charging system 200 is determined to be under normal connection, power can be transmitted from the power regulator 11 at the power adapter 10 to the load 21 at the electronic device 20 (the step S16A of FIG. 5A).

Or, in another embodiment, as shown in FIG. 4A, once the charging system 300 is determined to be under normal connection, the control circuit 22 of the electronic device 20 receives information indicating the normal connection from the control circuit 32 of the power adapter 10 through the signal transmission line 72 (the information indicating the normal connection is expressed by a communication signal CC). The control circuit 22 generates a switch control signal Sw according to the communication signal CC indicating normal connection, to keep conducting the switch 310 so that power is transmitted from the power regulator 11 at the power adapter 10 to the load 21 at the electronic device 20 (the step S16B of FIG. 5A).

Please still refer to FIG. 3 and FIG. 5A in conjugation with FIG. 2C and FIG. 4B. Under an abnormal connection wherein there are dusts or unwanted materials within or on the connection port between the power adapter 10 and the cable 70 or between the electronic device 20 and the cable 70, the positive power transmission line 71 and the negative power transmission line 73 may be shorted to form another current path, as shown by a dashed line resistor R35 in FIG. 2C and FIG. 4B (in this embodiment, as an illustrative example, the current path represented by the dashed line resistor R35 is shown to be located at the connection port between the electronic device 20 and the cable 70; however, the current leakage path can be located anywhere else, which can still be detected by the present invention. For example, the current leakage path may exist in the connection port between the power adapter 10 and the cable 70, namely between the node VA and the node GNDA). Because the output current I is higher than the predetermined current threshold Ith before the output voltage Vout has reached the predetermined voltage threshold Vth (as shown by the dashed line Ab in FIG. 3; e.g., when the output voltage is V2), it can be determined that the charging system 200 or 300 is under abnormal connection (the step S15 of FIG. 5A).

Next, in one embodiment, as shown in FIG. 2C, once the charging system 200 is determined to be under abnormal connection, the charging system 200 will stop transmitting power from the power regulator 11 in the power adapter 10 to the load 21 in the electronic device 20 (the step S17A of FIG. 5A).

Or, in another embodiment, as shown in FIG. 4B, once the charging system 300 is determined to be under abnormal connection, the control circuit 22 of the electronic device 20 receives information indicating the abnormal connection from the control circuit 32 of the power adapter 10 through the signal transmission line 72 (the information indicating the abnormal connection is expressed by a communication signal CC). The control circuit 22 generates a switch control signal Sw according to the communication signal CC indicating abnormal connection, to disconnect the switch 310 so that the charging system 300 stops transmitting power from the power regulator 11 in the power adapter 10 to the load 21 in the electronic device 20 (the step S17B of FIG. 5A).

Alternatively, when an abnormal connection is detected, an alarm signal can be generated instead of stopping transmitting power immediately. For example, the power adapter 10 or the electronic device 20 can display text or generate sound or twinkling light.

Figure 5B:
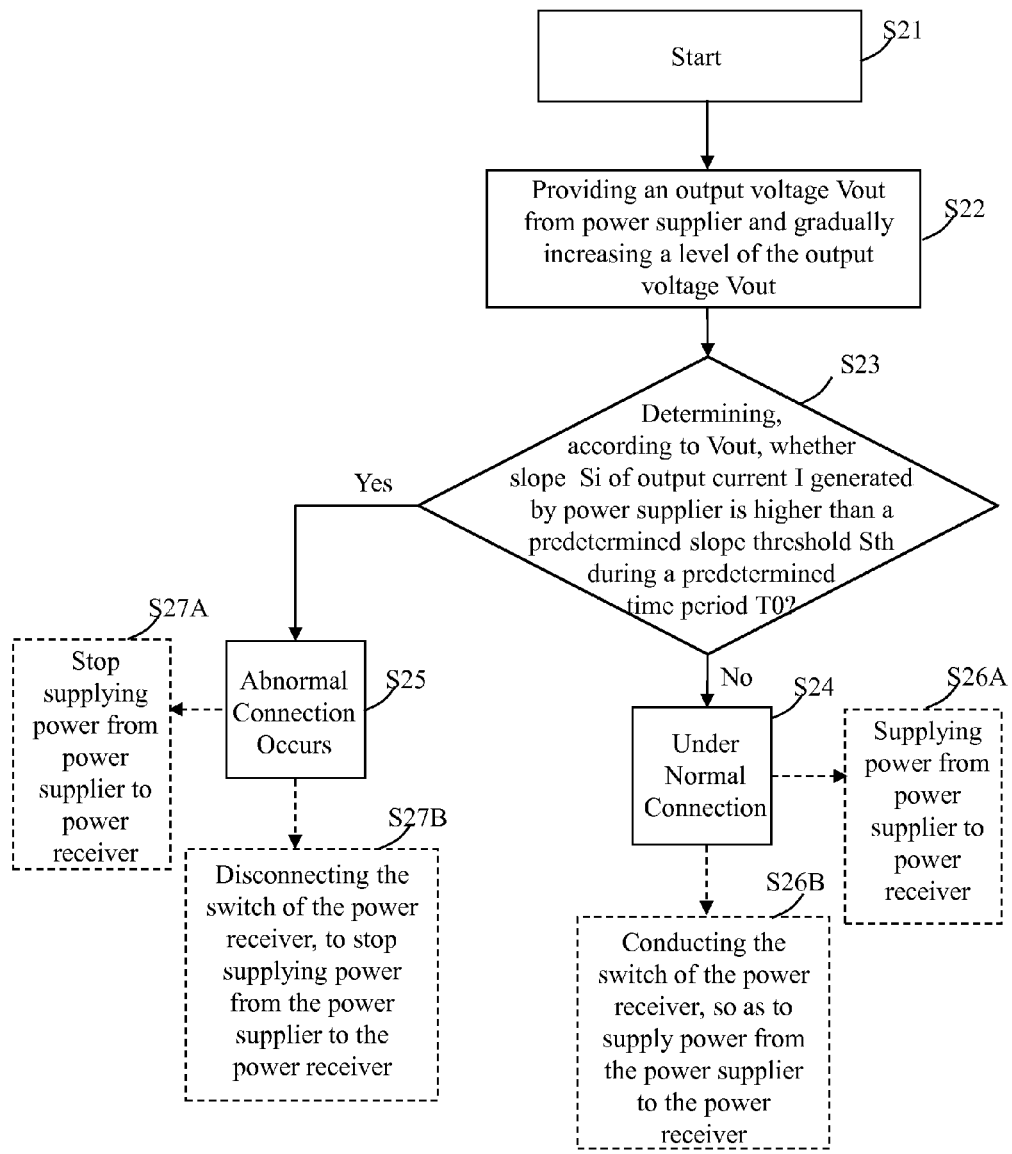
FIG. 5B shows a flow chart of an abnormal connection detection method according to another embodiment of the present invention.

Please refer to FIG. 3 and FIG. 5B. FIG. 5B shows a flow chart of the abnormal connection detection method according to another embodiment of the present invention. The abnormal connection detection method of this embodiment comprises the following steps: in the beginning (the step S21 of FIG. 5B), the power adapter 10 (acting as a power supplier) provides an initial output voltage Vout from the power regulator 11. In this embodiment, the level of the initial output voltage Vout gradually increases (the step S22 of FIG. 5B). Next (the step S23 of FIG. 5B), according to the increasing output voltage Vout, the abnormal connection detection method of this embodiment detects a slope Si of an output current I generated by the power regulator 11, to determine whether this slope Si is higher than a predetermined slope threshold Sth during a predetermined time period T0 (as shown in FIG. 3). As described above, the current sensing circuit 14 senses the output current I generated by the power regulator 11 and transmits the information related to the output current I to the control circuit 12 (as shown in FIGS. 2B-2C) or the control circuit 32 (as shown in FIGS. 4A-4B). Therefore, the control circuit 12 or the control circuit 32 can calculate the slope Si of the output current I.

For example, as shown in FIG. 3, assuming that at a first time point T1 the level of the output voltage Vout provided by the power regulator 11 is V1, and at a second time point T2 the level of the output voltage Vout provided by the power regulator 11 is V2, the slope Si of the output current I during the predetermined time period T0 can be calculated according to the levels of the output current I corresponding to the levels V1 and V2 of the output voltage Vout. If the slope Si of the output current I is lower than the predetermined slope threshold Sth during the predetermined time period T0 (as shown by the solid line No in FIG. 3), it can be determined that the charging system 200 or 300 is under normal connection (the step S24 of FIG. 5B).

Next, in one embodiment, as shown in FIG. 2B, once the charging system 200 is determined to be under normal connection, power can be transmitted from the power regulator 11 in the power adapter 10 to the load 21 in the electronic device 20 (the step S26A of FIG. 5B).

Or, in another embodiment, as shown in FIG. 4A, once the charging system 300 is determined to be under normal connection, the control circuit 22 of the electronic device 20 receives information indicating the normal connection from the control circuit 32 of the power adapter 10 through the signal transmission line 72 (the information indicating the normal connection is expressed by a communication signal CC). The control circuit 22 generates a switch control signal Sw according to the communication signal CC indicating normal connection, to keep conducting the switch 310 so that power is transmitted from the power regulator 11 at the power adapter 10 to the load 21 at the electronic device 20 (the step S26B of FIG. 5B).

Please still refer to FIG. 3 and FIG. 5B in conjugation with FIG. 2C and FIG. 4B. Under an abnormal connection wherein there are dusts or unwanted materials within or on the connection port between the power adapter 10 and the cable 70 or between the electronic device 20 and the cable 70, the positive power transmission line 71 and the negative power transmission line 73 may be shorted to form another current path, as shown by a dashed line resistor R35 in FIG. 2C and FIG. 4B. Under such circumstance, because the slope Si of the dashed line Ab is higher than the predetermined slope threshold Sth during the predetermined time period T0, it can be determined that the charging system 200 or 300 is under abnormal connection (the step S25 of FIG. 5B).

Next, in one embodiment, as shown in FIG. 2C, once the charging system 200 is determined to be under abnormal connection, the charging system 200 can stop transmitting power from the power regulator 11 in the power adapter 10 to the load 21 in the electronic device 20 (the step S27A of FIG. 5B).

Or, in another embodiment, as shown in FIG. 4B, once the charging system 300 is determined to be under abnormal connection, the control circuit 22 of the electronic device 20 receives information indicating the abnormal connection from the control circuit 32 of the power adapter 10 through the signal transmission line 72 (the information indicating the abnormal connection is expressed by a communication signal CC). The control circuit 22 generates a switch control signal Sw according to the communication signal CC indicating abnormal connection, to disconnect the switch 310 so that the charging system 300 stops transmitting power from the power regulator 11 in the power adapter 10 to the load 21 in the electronic device 20 (the step S27B of FIG. 5B).

Alternatively, when an abnormal connection is detected, an alarm signal can be generated instead of stopping transmitting power immediately. For example, the power adapter 10 or the electronic device 20 can display text or generate sound or twinkling light.

Figure 6:
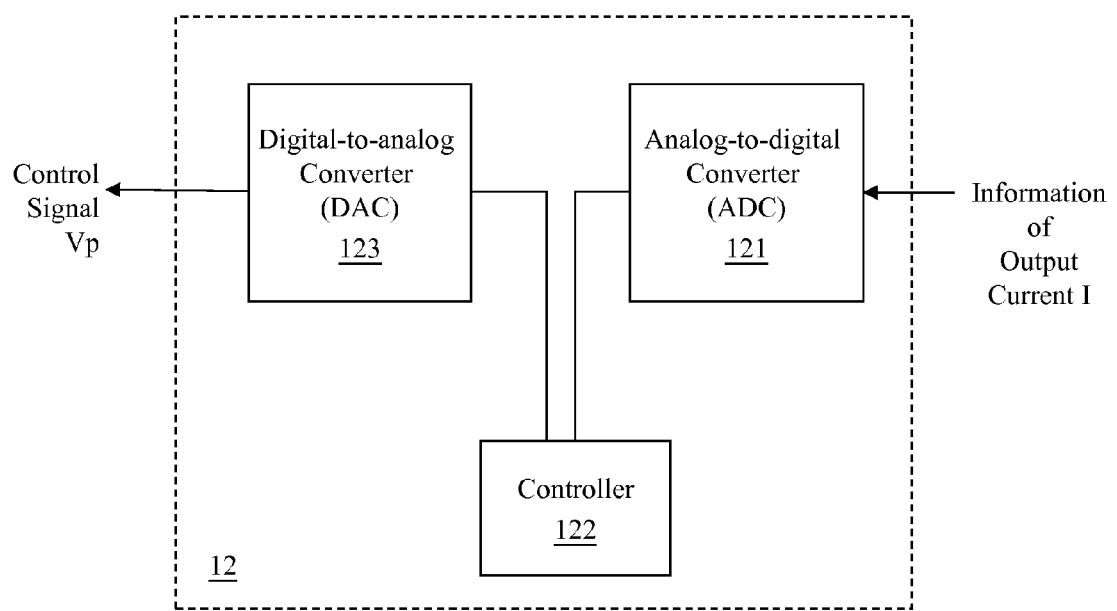
FIG. 6 shows an embodiment of a control circuit 12.
Figure 7:
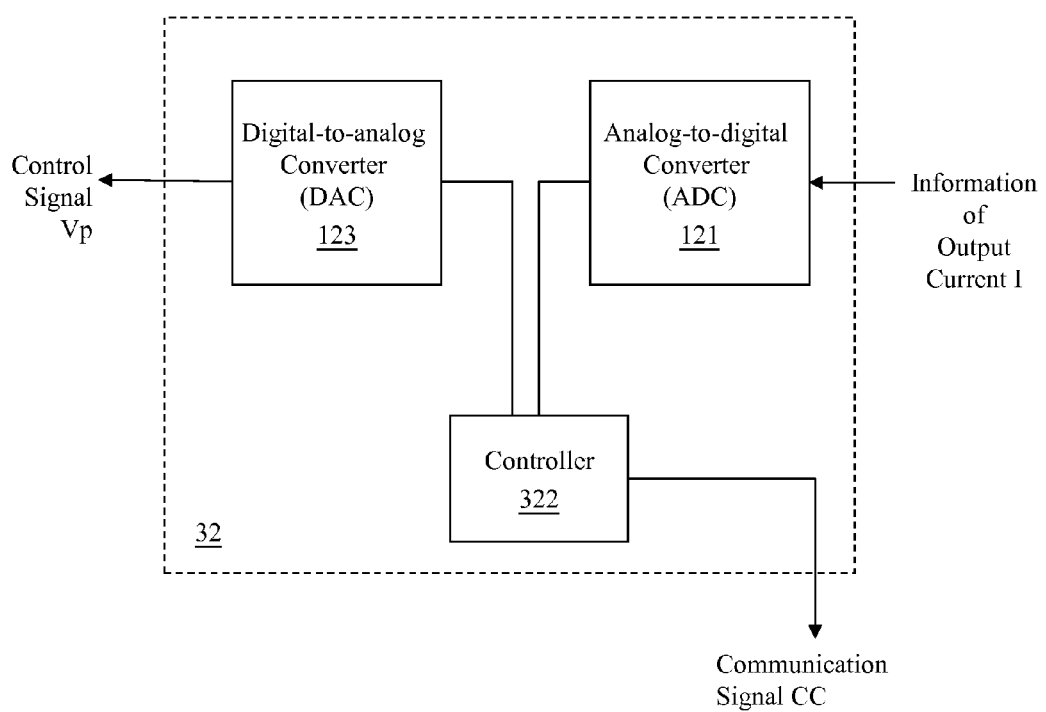
FIG. 7 shows an embodiment of a control circuit 32.

With respect to how the control circuit 12 or the control circuit 32 generates the control signal Vp according to the information related to the output current I, please refer to FIGS. 6-7. FIG. 6 shows an embodiment of t control circuit 12. FIG. 7 shows an embodiment of a control circuit 32.

As shown in FIG. 6, in one embodiment, the control circuit 12 includes an analog-to-digital converter (ADC) 121, a controller 122 and a digital-to-analog converter (DAC) 123. The ADC 121 receives the information related to the output current I and converts such information to a digital signal. The converted digital signal is inputted to the controller 122. Accordingly, the controller 122 can determine whether the output current I is higher than the predetermined current threshold Ith (the step S13 of FIG. 5A; as shown in FIG. 3) or whether the slope Si of the output current I is higher than the predetermined slope threshold Sth during the predetermined time period T0 (the step S23 of FIG. 5B; as shown in FIG. 3). The controller 122 generates a corresponding output according to the above-mentioned determination. The output generated form the controller 122 is converted by the DAC 123. The converted analog signal is then outputted as the control signal Vp, to control the operation of the power regulator 11, so that the power transmission from the power regulator 11 in the power adapter 10 to the load 21 in the electronic device 20 is under control.

As shown in FIG. 7, in one embodiment, the control circuit 32 includes an analog-to-digital converter (ADC) 121, a controller 322 and a digital-to-analog converter (DAC) 123. The ADC 121 receives the information related to the output current I and converts such information to a digital signal. The converted digital signal is inputted to the controller 322. Accordingly, the controller 322 can determine whether the output current I is higher than the predetermined current threshold Ith (the step S13 of FIG. 5A; as shown in FIG. 3) or whether the slope Si of the output current I is higher than the predetermined slope threshold Sth during the predetermined time period T0 (the step S23 of FIG. 5B; as shown in FIG. 3). The controller 322 generates a corresponding output according to the above-mentioned determination. The output generated form the controller 322 is converted by the DAC 123. The converted analog signal is then outputted as the control signal Vp, to control the operation of the power regulator 11, so that the power transmission from the power regulator 11 in the power adapter 10 to the load 21 in the electronic device 20 is under control. The controller 322 can further generate, in addition to an output to the DAC 123, a communication signal CC. The control circuit 22 of the electronic device 20 receives the communication signal CC indicating that the charging system 300 is under normal connection or abnormal connection from the control circuit 32 of the power adapter 10 through the signal transmission line 72. The control circuit 22 of the electronic device 20 generates the switch control signal Sw to control the switch 310 according to the communication signal CC.

The above-mentioned embodiments of the control circuit 12 and the control circuit 32 are only for illustrative purpose, but not for limiting the scope of the present invention. Those skilled in this art can readily conceive variations and modifications of other ways to embody of the control circuit 12 and the control circuit 32. For example, if the information of the output current I and the predetermined current threshold Ith are compared with each other in the form of analog signals, the ADC 121 is not necessarily required and therefore can be omitted. For another example, if the control circuit 12 and the control circuit 32 control the power regulator 11 by an analog signal, then it is not necessary to generate a digital control signal Vp. Under such circumstance, the DAC 123 can be omitted.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. In view of the foregoing, the spirit of the present invention should cover all such and other modifications and variations, which should be interpreted to fall within the scope of the following claims and their equivalents.

What is claimed is:

1. An abnormal connection detection method for detecting an abnormal connection between a power supplier and a power receiver, wherein the power supplier and the power receiver are connected through a cable, the cable including positive and negative power transmission lines, the abnormal connection detection method comprising:

providing an output voltage from the power supplier, wherein, before a load in the power receiver starts a normal operation, the output voltage is lower than a predetermined voltage threshold, wherein the predetermined voltage threshold is lower than a voltage required for the normal operation of the load in the power receiver;

before the load in the power receiver starts the normal operation, detecting, according to the output voltage, whether an output current generated by the power supplier is higher than a predetermined current threshold; and when the output current is higher than the predetermined current threshold, determining that an abnormal connection occurs between the power supplier and the power receiver.

2. The abnormal connection detection method of claim 1, further comprising:

when the output current is lower than the predetermined current threshold, determining that a normal connection occurs between the power supplier and the power receiver.

3. The abnormal connection detection method of claim 1, further comprising:

when the abnormal connection occurs, stop supplying power from the power supplier to the power receiver.

4. The abnormal connection detection method of claim 1, wherein:
the cable further includes a signal transmission line, for transmitting a signal between the power supplier and the power receiver; and
the power receiver further includes a switch, for enabling or disabling the power receiver to receive power from the power supplier.

5. The abnormal connection detection method of claim 4, further comprising:
when the output current is lower than the predetermined current threshold, determining that a normal connection occurs between the power supplier and the power receiver;
the power receiver receiving information indicating the normal connection from the power supplier through the signal transmission line; and
conducting the switch of the power receiver so as to supply power from the power supplier to the power receiver.

6. The abnormal connection detection method of claim 4, further comprising:
when the abnormal connection occurs, the power receiver receiving information indicating the abnormal connection from the power supplier through the signal transmission line; and
disconnecting the switch of the power receiver to stop supplying power from the power supplier to the power receiver.

7. An abnormal connection detection method for detecting an abnormal connection between a power supplier and a power receiver, wherein the power supplier and the power receiver are connected through a cable, the cable includes positive and negative power transmission lines, the abnormal connection detection method comprising:
providing an output voltage from the power supplier and gradually increasing a level of the output voltage, wherein, before a load in the power receiver starts a normal operation, the level of the output voltage is lower than a predetermined voltage threshold, wherein the predetermined voltage threshold is lower than a voltage required for the normal operation of the load in the power receiver;
determining, according to the output voltage, whether a slope of an output current generated by the power supplier is higher than a predetermined slope threshold during a predetermined time period, wherein the predetermined time period is a time period before the load in the power receiver starts the normal operation; and
when the slope is higher than the predetermined slope threshold during the predetermined time period, determining that an abnormal connection occurs between the power supplier and the power receiver.

8. The abnormal connection detection method of claim 7, further comprising:
when the slope is lower than the predetermined slope threshold during the predetermined time period, determining that a normal connection occurs between the power supplier and the power receiver.

9. The abnormal connection detection method of claim 7, further comprising:
when the abnormal connection occurs, stop supplying power from the power supplier to the power receiver.

10. The abnormal connection detection method of claim 7, wherein:
the cable further includes a signal transmission line, for transmitting a signal between the power supplier and the power receiver; and
the power receiver further includes a switch, for enabling or disabling the power receiver to receive power from the power supplier.

11. The abnormal connection detection method of claim 10, further comprising:
when the slope is lower than the predetermined slope threshold during the predetermined time period, determining that a normal connection occurs between the power supplier and the power receiver;
the power receiver receiving information indicating the normal connection from the power supplier through the signal transmission line; and
conducting the switch of the power receiver so as to supply power from the power supplier to the power receiver.

12. The abnormal connection detection method of claim 10, further comprising:
when the abnormal connection occurs, the power receiver receiving information indicating the abnormal connection from the power supplier through the signal transmission line; and
disconnecting the switch of the power receiver to stop supplying power from the power supplier to the power receiver.

* * * * *